(12) United States Patent
Jung et al.

(10) Patent No.: US 11,211,911 B2
(45) Date of Patent: Dec. 28, 2021

(54) CAPACITIVE-COUPLED BANDPASS FILTER

(71) Applicant: SKYWORKS SOLUTIONS, INC., Irvine, CA (US)

(72) Inventors: Dongjin Jung, Thousand Oaks, CA (US); Hanseung Lee, Thousand Oaks, CA (US); Weimin Sun, Santa Rosa Valley, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 11 days.

(21) Appl. No.: 16/742,345

(22) Filed: Jan. 14, 2020

(65) Prior Publication Data

US 2020/0228085 A1 Jul. 16, 2020

Related U.S. Application Data

(60) Provisional application No. 62/792,435, filed on Jan. 15, 2019.

(51) Int. Cl.
*H03H 7/01* (2006.01)
*H03H 7/12* (2006.01)
*H03H 7/46* (2006.01)

(52) U.S. Cl.
CPC ............ *H03H 7/0115* (2013.01); *H03H 7/12* (2013.01); *H03H 7/1758* (2013.01); *H03H 7/1775* (2013.01); *H03H 7/463* (2013.01)

(58) Field of Classification Search
CPC ...... H03H 7/0115; H03H 7/12; H03H 7/1758; H03H 7/1775; H03H 7/1791; H03H 7/1741; H03H 7/01
USPC ......................................... 333/175, 176, 168
See application file for complete search history.

(56) References Cited

U.S. PATENT DOCUMENTS

| | | | | |
|---|---|---|---|---|
| 10,666,200 | B2 * | 5/2020 | Gebeyehu | ............... H03F 3/193 |
| 2006/0052131 | A1 * | 3/2006 | Ichihara | ................. H04B 1/406 |
| | | | | 455/552.1 |
| 2013/0106532 | A1 * | 5/2013 | Jin | ......................... H03H 7/075 |
| | | | | 333/168 |
| 2017/0338789 | A1 * | 11/2017 | Mukai | ..................... H01G 4/30 |

* cited by examiner

*Primary Examiner* — Stephen E. Jones
(74) *Attorney, Agent, or Firm* — Lando & Anastasi, LLP (57) ABSTRACT

Examples of a capacitive-coupled bandpass filter include a plurality of coupling capacitors connected in series along a signal path extending between an input contact and an output contact, a first harmonic suppression notch circuit configured to provide a first harmonic suppression notch in a frequency response of the capacitive-coupled bandpass filter, and a second harmonic suppression notch circuit configured to provide a second harmonic suppression notch in the frequency response of the capacitive-coupled bandpass filter. The first harmonic suppression notch circuit includes a first pair of series L/C resonators connected in shunt between the signal path and a reference potential, and the second harmonic suppression notch circuit includes a second pair of series L/C resonators connected in shunt between the signal path and the reference potential.

28 Claims, 6 Drawing Sheets

CAPACITIVE-COUPLED BANDPASS FILTER

CROSS-REFERENCE TO RELATED APPLICATIONS

This application claims priority under 35 U.S.C. § 119(e) to U.S. Provisional Patent application Ser. No. 62/792,435, titled "CAPACITIVE-COUPLED BANDPASS FILTER," filed Jan. 15, 2019, which is incorporated by reference herein in its entirety for all purposes.

BACKGROUND

Filters are used in many different modules of communications devices, including wireless devices such as mobile phones. For example, bandpass filters are used in transceivers and radio frequency (RF) front-end modules. As the frequency increases, the ability to achieve a filter design with low loss, sharp cut-off (also called "skirt") characteristics, and good harmonic suppression is limited by metal loss (skin depth) and the Q-factor of the inductors and capacitors used to make the filters.

Figure 1:
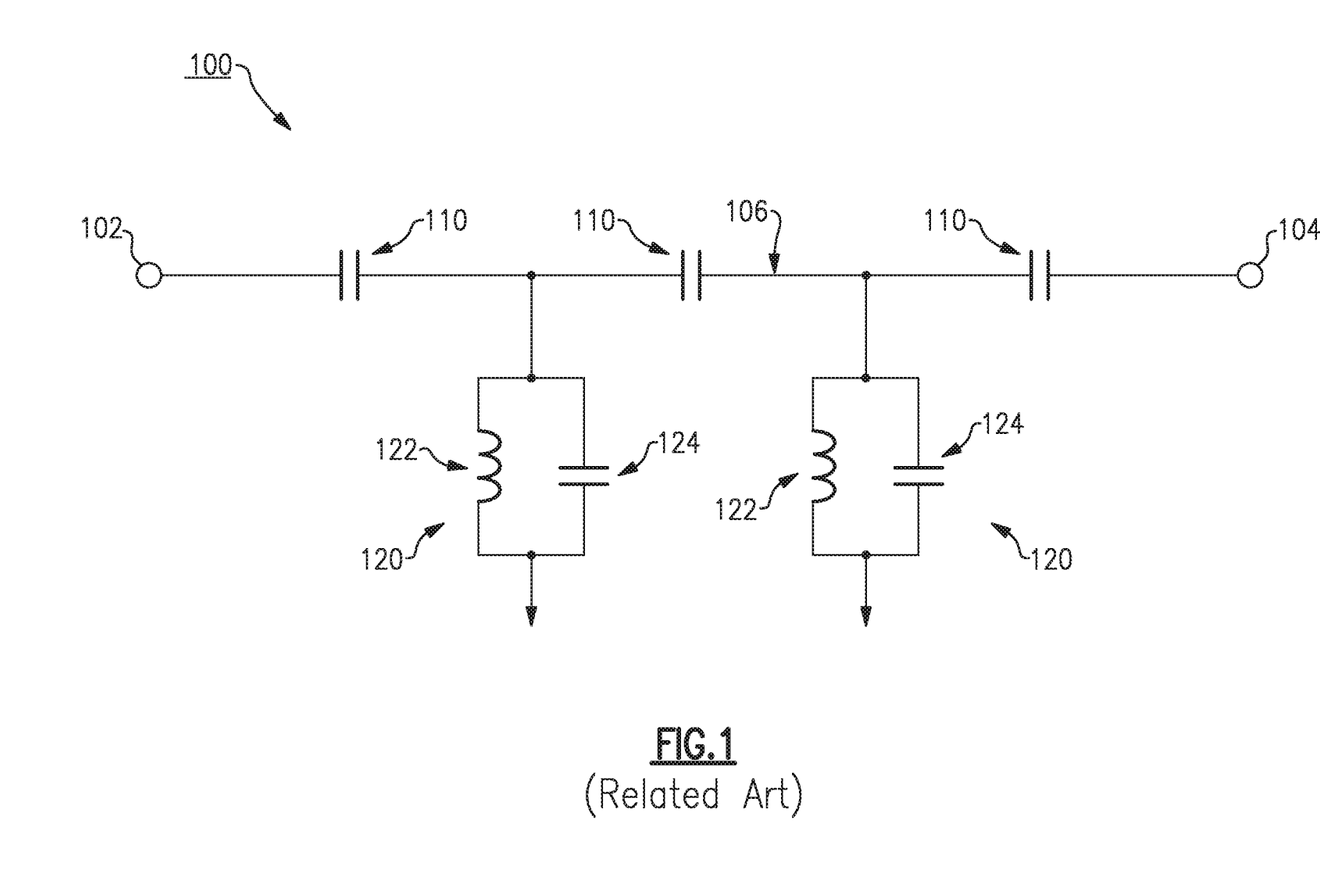
FIG. 1 is a schematic circuit diagram of one example of a conventional capacitive-coupled bandpass filter.

A commonly-used bandpass filter design is the capacitive-coupled filter, an example of which is shown in FIG. 1. The capacitive-coupled bandpass filter 100 includes a plurality of series capacitors 110 connected in series with one another along a series path 106 between an input contact 102 and an output contact 104, and one or more shunt resonators 120. In the example shown in FIG. 1, the filter 100 includes a pair of shunt resonators 120. Each shunt resonator 120 includes an inductor 122 connected in parallel with a capacitor 124 between the series path 106 and a reference potential, such as ground. The conventional capacitive-coupled bandpass filter topology, such as the example shown in FIG. 1, has advantages over inductive-coupled bandpass filters, such as a lower number of filter elements (for equivalent performance and frequency band(s) of operation) and better insertion loss at higher frequencies. However, the conventional capacitive-coupled bandpass filter 100 does not provide adequate harmonic suppression for certain applications, particularly for some higher-frequency wireless communications applications.

SUMMARY OF INVENTION

Aspects and embodiments are directed to a capacitive-coupled filter design that provides improved harmonic suppression, while also maintaining a compact form, low insertion loss, and a sharp frequency cut-off profile.

According to one embodiment, a capacitive-coupled bandpass filter comprises a plurality of series coupling capacitors connected in series along a signal path extending between an input contact and an output contact, a first shunt arm including a first capacitor and a first inductor connected in series between a first point along the signal path and a reference potential, a second shunt arm connected in parallel with the first shunt arm between the first point along the signal path and the reference potential, the second shunt arm including a second capacitor connected in series with a second inductor, a third shunt arm including a third capacitor and a third inductor connected in series between a second point along the signal path and the reference potential, and a fourth shunt arm connected in parallel with the third shunt arm between the second point along the signal path and the reference potential, the fourth shunt arm including a fourth capacitor connected in series with a fourth inductor.

In one example, the plurality of series coupling capacitors includes a first coupling capacitor connected in series between the input contact and the first point along the signal path, a second coupling capacitor connected in series between the first point along the signal path and the second point along the signal path, and a third coupling capacitor connected in series between the second point along the signal path and the output contact. In one example, the plurality of series coupling capacitors are integrated passive device components. In another example, the second capacitor and the fourth capacitor are surface mount components. In another example, the capacitive-coupled bandpass filter is implemented in a multi-chip module, and wherein the second inductor and the fourth inductor are implemented as printed coils on a substrate of the multi-chip module. In one example, the first capacitor, the first inductor, the third capacitor, and the third inductor are integrated passive device components.

In another example, the first shunt arm and the third shunt arm together are configured to provide a first harmonic suppression notch in a frequency response of the capacitive-coupled bandpass filter. In one example, the second shunt arm and the fourth shunt arm together are configured to provide a second harmonic suppression notch in the frequency response of the capacitive-coupled bandpass filter. In another example, the first harmonic suppression notch is at a frequency of 2.4 GHz, and the second harmonic suppression notch is at a frequency of 5.4 GHz.

According to another embodiment, a radio frequency (RF) front-end module comprises a transceiver configured to generate RF transmit signals for transmission and to receive and process received RF signals, and a power amplifier module configured to receive and amplify the RF transmit signals from the transceiver, at least one of the transceiver and the power amplifier module including an example of the capacitive-coupled bandpass filter discussed above.

In one example, the RF front-end module further comprises an antenna port, and a duplexer coupled between the power amplifier module and the antenna port and configured to direct the RF transmit signals from the power amplifier module to the antenna port and to direct the received RF signals from the antenna port to the transceiver.

In another example, the RF front-end module further comprises a low noise amplifier module coupled between the duplexer and the transceiver and configured to receive and amplify the received RF signals. The RF front-end module may further comprise an antenna switch connected between the duplexer and the antenna port. In one example, the transceiver includes a transmitter circuit configured to generate the RF transmit signals and a receiver circuit configured to process the received RF signals, the receiver circuit including the capacitive-coupled bandpass filter.

According to another embodiment, a wireless device comprises an antenna, an antenna switch module coupled to the antenna, a transceiver configured to generate RF transmit signals for transmission by the antenna and to receive and process received RF signals from the antenna, a power amplifier module coupled between the transceiver and the antenna switch module and configured to receive and amplify the RF transmit signals from the transceiver, at least one of the transceiver and the power amplifier module including an example of the capacitive-coupled bandpass filter discussed above, and a low noise amplifier module coupled between the antenna switch module and the transceiver and configured to receive and amplify the received RF signals from the antenna switch module.

In one example, the wireless device further comprises an electromagnetic coupler coupled between the power amplifier module and the antenna switch module and configured to electromagnetically couple portions of the RF transmit signals from a transmit signal path extending between the power amplifier module and the antenna switch module to provide coupled signals, and a sensor module configured to receive the coupled signals from the electromagnetic coupler and to provide control signals to at least one of the transceiver and the power amplifier module based on the coupled signals. The wireless device may further comprise a power management system coupled to the transceiver and configured to manage power for operation of the wireless device. In one example, the wireless device further comprises a baseband sub-system coupled to the transceiver, a user interface connected to the baseband sub-system, and a memory connected to the baseband sub-system and configured to store data. In another example, the transceiver includes a transmitter circuit configured to generate the RF transmit signals and a receiver circuit configured to process the received RF signals, the receiver circuit including the capacitive-coupled bandpass filter.

According to another embodiment, a capacitive-coupled bandpass filter comprises a plurality of coupling capacitors connected in series along a signal path extending between an input contact and an output contact, a first harmonic suppression notch circuit configured to provide a first harmonic suppression notch in a frequency response of the capacitive-coupled bandpass filter, the first harmonic suppression notch circuit including a first pair of series L/C resonators connected in shunt between the signal path and a reference potential, and a second harmonic suppression notch circuit configured to provide a second harmonic suppression notch in the frequency response of the capacitive-coupled bandpass filter, the second harmonic suppression notch circuit including a second pair of series L/C resonators connected in shunt between the signal path and the reference potential.

In one example, the first harmonic suppression notch is at 2.4 GHz and the second harmonic suppression notch is at 5.4 GHz. In another example, a passband of the capacitive-coupled bandpass filter extends from 3.4 GHz to 3.8 GHz. In another example, the capacitive-coupled bandpass filter has an insertion loss in the passband of less than 1.1 dB. In another example, the capacitive-coupled bandpass filter has an insertion loss in each of the first and second harmonic suppression notches of greater than 30 dB.

In one example, the first pair of series L/C resonators includes a first shunt arm and a third shunt arm, the first shunt arm having a first capacitor connected in series with a first inductor between a first point along the signal path and the reference potential, and the third shunt arm having a third capacitor connected in series with a third inductor between a second point along the signal path and the reference potential, and the second pair of series L/C resonators includes a second shunt arm connected in parallel with the first shunt arm between the first point along the signal path and the reference potential, and a fourth shunt arm connected in parallel with the second shunt arm between the second point along the signal path and the reference potential, the second shunt arm having a second inductor connected in series with a second capacitor, and the fourth shunt arm having a fourth inductor connected in series with a fourth capacitor. In another example, the plurality of coupling capacitors includes a first coupling capacitor connected in series between the input contact and the first point along the signal path, a second coupling capacitor connected in series between the first point along the signal path and the second point along the signal path, and a third coupling capacitor connected in series between the second point along the signal path and the output contact. In one example, the plurality of coupling capacitors are integrated passive device components. In another example, the first capacitor, the third capacitor, the first inductor, and the third inductor are integrated passive device components. In another example, the second capacitor and the fourth capacitor are surface mount components. In one example, the capacitive-coupled bandpass filter is implemented in a multi-chip module, and wherein the second inductor and the fourth inductor are implemented as printed coils on a substrate of the multi-chip module.

In another example, the first inductor and the second capacitor together form a first passband resonator, the third inductor and the fourth capacitor together form a second passband resonator, and the first and second passband resonators together with the plurality of coupling capacitors configure a passband of the capacitive-coupled bandpass filter. In one example, the passband of the capacitive-coupled bandpass filter extends from 3.4 GHz to 3.8 GHz. In another example, the first harmonic suppression notch is at 2.4 GHz and the second harmonic suppression notch is at 5.4 GHz. In another example, the capacitive-coupled bandpass filter has an insertion loss in the passband of less than 1.1 dB. In another example, the capacitive-coupled bandpass filter has an insertion loss in each of the first and second harmonic suppression notches of greater than 30 dB.

Another embodiment is directed to a radio frequency (RF) front-end module comprising a transceiver configured to generate RF transmit signals for transmission and to receive and process received RF signals, and a power amplifier module configured to receive and amplify the RF transmit signals from the transceiver, at least one of the transceiver and the power amplifier module including an example of the capacitive-coupled bandpass filter discussed above.

In one example, the RF front-end module further comprises an antenna port, and a duplexer coupled between the power amplifier module and the antenna port and configured to direct the RF transmit signals from the power amplifier module to the antenna port and to direct the received RF signals from the antenna port to the transceiver. The RF front-end module may further comprise a low noise amplifier module coupled between the duplexer and the transceiver and configured to receive and amplify the received RF signals. In one example, the RF front-end module further comprises an antenna switch connected between the duplexer and the antenna port. In another example, the transceiver includes a transmitter circuit configured to generate the RF transmit signals and a receiver circuit configured to process the received RF signals, the receiver circuit including the capacitive-coupled bandpass filter.

According to another embodiment, a wireless device comprises an antenna, an antenna switch module coupled to the antenna, a transceiver configured to generate RF transmit signals for transmission by the antenna and to receive and process received RF signals from the antenna, a power amplifier module coupled between the transceiver and the antenna switch module and configured to receive and amplify the RF transmit signals from the transceiver, at least one of the transceiver and the power amplifier module including an example of the capacitive-coupled bandpass filter discussed above, and a low noise amplifier module coupled between the antenna switch module and the transceiver and configured to receive and amplify the received RF signals from the antenna switch module.

In one example, the wireless device further comprises an electromagnetic coupler coupled between the power amplifier module and the antenna switch module and configured to electromagnetically couple portions of the RF transmit signals from a transmit signal path extending between the power amplifier module and the antenna switch module to provide coupled signals, and a sensor module configured to receive the coupled signals from the electromagnetic coupler and to provide control signals to at least one of the transceiver and the power amplifier module based on the coupled signals. In another example, the wireless further comprises a power management system coupled to the transceiver and configured to manage power for operation of the wireless device. The wireless device may further comprise a baseband sub-system coupled to the transceiver, a user interface connected to the baseband sub-system, and a memory connected to the baseband sub-system and configured to store data. In one example, the transceiver includes a transmitter circuit configured to generate the RF transmit signals and a receiver circuit configured to process the received RF signals, the receiver circuit including the capacitive-coupled bandpass filter.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments are directed to capacitive-coupled bandpass filters, and to modules and devices incorporating the same.

Bandpass filters are used in a variety of wireless device modules and components, including power amplifier and receiver modules. As discussed above, as the operating frequency bands for the filters increases, the ability to achieve low loss, sharp cut-off characteristics, and good harmonic suppression can be limited by the metal loss (skin depth) and Q-factors of the inductors and capacitors used in the filter design. However, ultra-high band bandpass filters may be essential components of modern wireless communications devices as these devices increasingly operate in higher frequency bands. Furthermore, multi-chip module designs used in wireless communications devices can require the filters to have compact size in order to accommodate the many components needed in these devices and to maintain small overall size suitable for handheld devices. Accordingly, aspects and embodiments are directed to a compact bandpass filter design that achieves low insertion loss, a sharp frequency cut-off characteristic, and good harmonic suppression. In particular, certain examples of the bandpass filter are configured to provide harmonic suppression notches at the commonly-used wifi frequencies of 2.4 gigahertz (GHz) and 5.4 GHz, as discussed further below.

Figure 2:
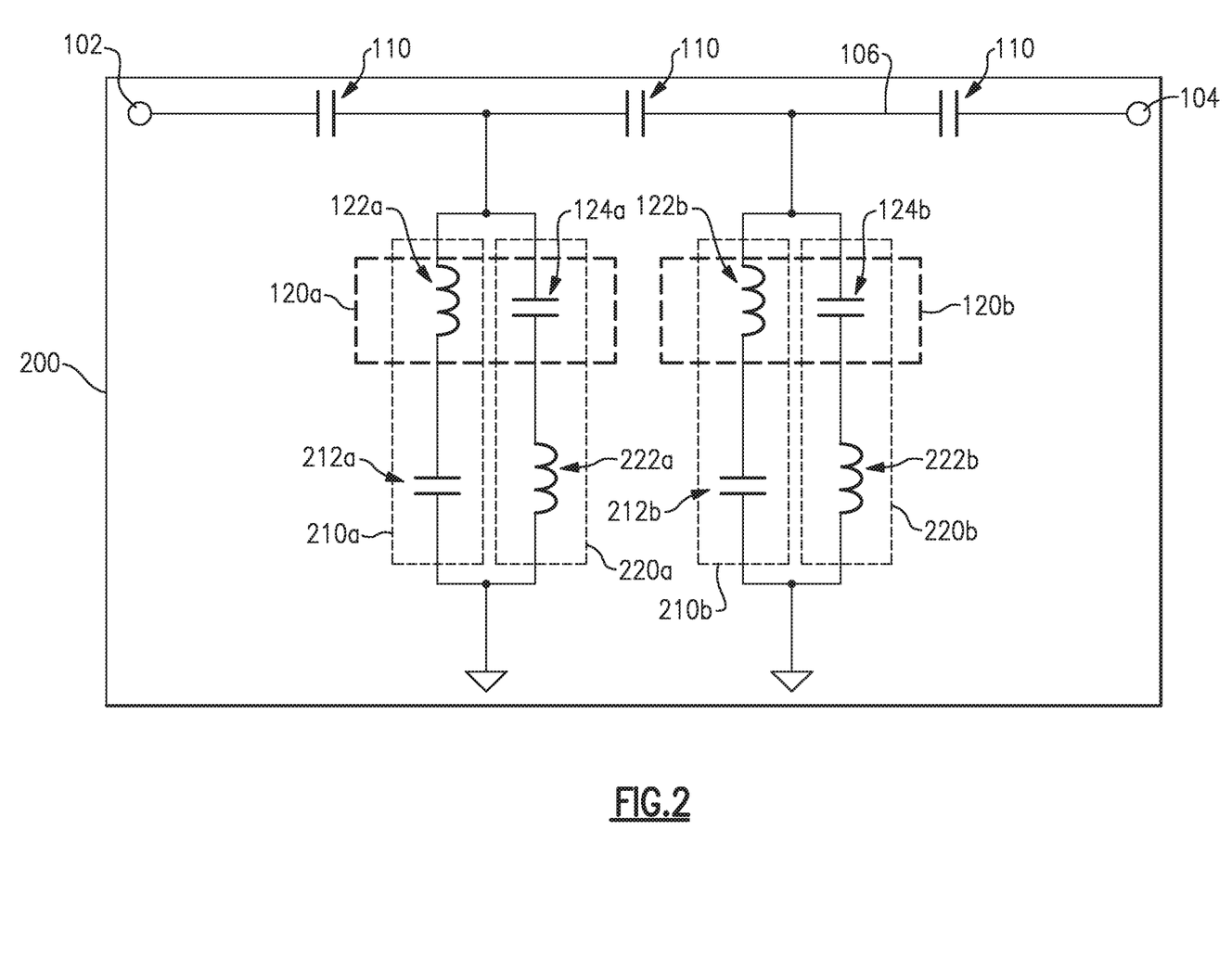
FIG. 2 is a schematic circuit diagram of one example of a capacitive-coupled bandpass filter according to aspects of the present invention.

Referring to FIG. 2, there is illustrated a schematic circuit diagram of one example of a capacitive-coupled bandpass filter according to certain embodiments. The filter 200 includes a plurality of series coupling capacitors 110 connected in series with one another along a series path 106 between an input contact 102 and an output contact 104. In the illustrated example, the filter 200 includes three series coupling capacitors 110; however, in other examples more or fewer series coupling capacitors 110 may be used depending, for example, on the desired filter characteristics or operating frequency band(s). The bandpass filter 200 further includes two pairs of parallel-connected shunt arms, each including an L/C circuit, as shown in FIG. 2. The first pair includes a first shunt arm 210a and a second shunt arm 220a connected in parallel with one another between the series path 106 and a reference potential, such as ground. Similarly, the second pair includes a third shunt arm 210b connected in parallel with a fourth shunt arm 220b between the series path 106 and the reference potential. Each shunt arm 210a, 210b, 220a, 220b includes an inductor connected in series with a capacitor. As shown in FIG. 2, the first shunt arm 210a includes a first inductor 122a connected in series with a first capacitor 212a, and the second shunt arm 220a includes a second capacitor 124a connected in series with a second inductor 222a. Similarly, the third shunt arm 210b includes a third inductor 122b connected in series with a third capacitor 212b, and the fourth shunt arm 220b includes a fourth capacitor 124b connected in series with a fourth inductor 222b. Those skilled in the art will appreciate that the capacitors and inductors in each arm may be connected in series in any order, not limited to the specific arrangement shown in FIG. 2.

The first inductor 122a and the second capacitor 124a together form a first passband resonator 120a, and the third inductor 122b together with the third capacitor 124b form a second passband resonator 120b. The two passband resonators 120a, 120b together contribute to configuring the frequency range of the passband of the bandpass filter 200. The two passband resonators 120a, 120b in combination with the plurality of series coupling capacitors 110 form a capacitive-coupled bandpass filter similar to that shown in FIG. 1. However, the conventional capacitive-coupled bandpass filter of FIG. 1 does not provide harmonic suppression notches. In contrast, the filter 200 is configured to provide two harmonic suppression notches. The first notch is provided by a combination of the first shunt arm 210a and the third shunt arm 210b, and the second notch is provided by a combination of the second shunt arm 220a and the fourth shunt arm 220b.

Figure 3:
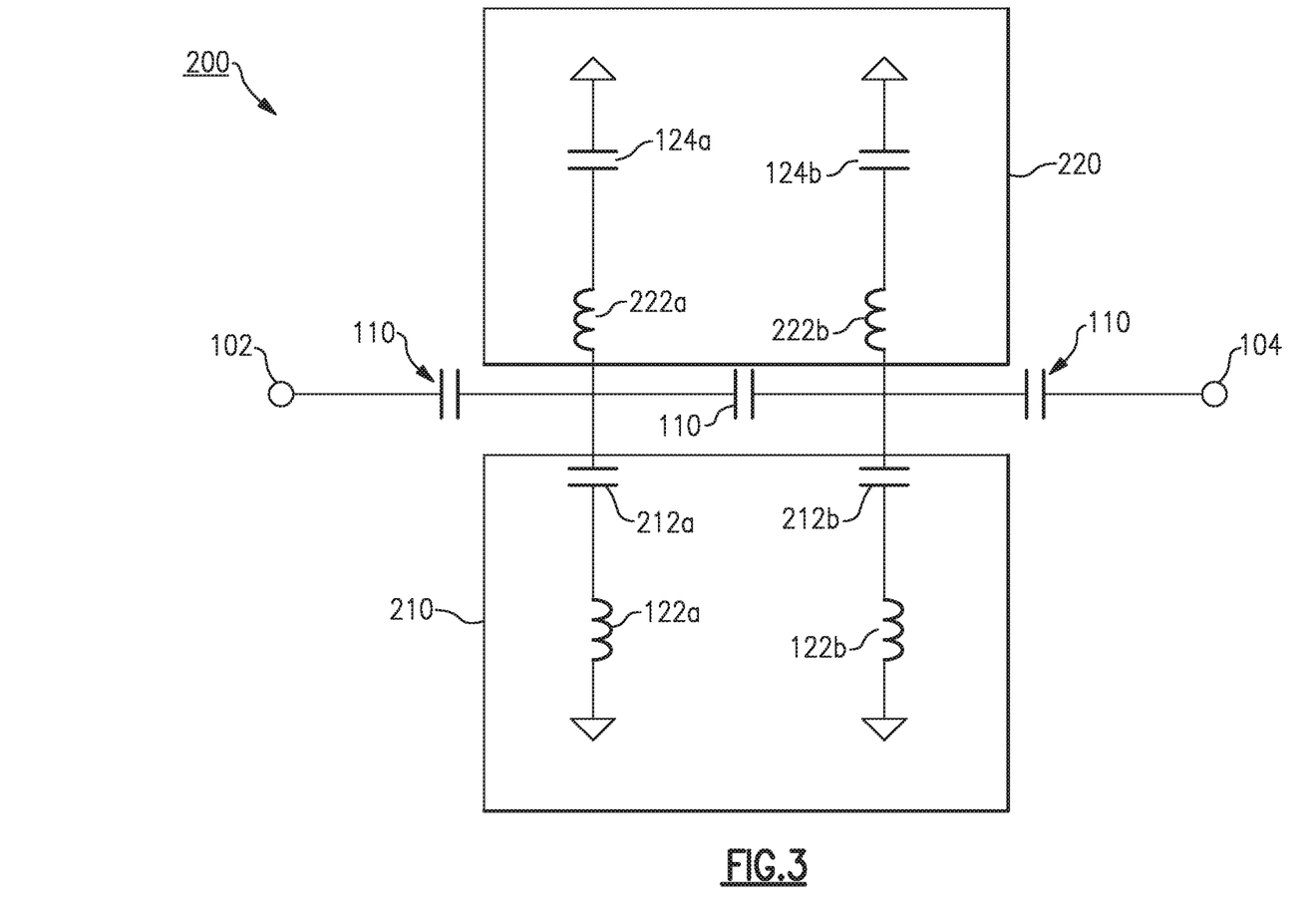
FIG. 3 is another representation of the capacitive-coupled bandpass filter shown in FIG. 2.

FIG. 3 is another schematic circuit diagram of the filter 200 having the same configuration as in FIG. 2, but drawn differently to highlight first and second notch circuits 210, 220. As discussed above, the first notch circuit 210 (made up of the first and third shunt arms 210a, 210b shown in FIG. 2) includes the first inductor 122a, the first capacitor 212a, the third inductor 122b, and the third capacitor 212b. Similarly, the second notch circuit 220 (made up of the second and fourth shunt arms 220a, 220b shown in FIG. 2) includes the second inductor 222a, the second capacitor 124a, the fourth inductor 222b, and the fourth capacitor 124b.

Figure 4:
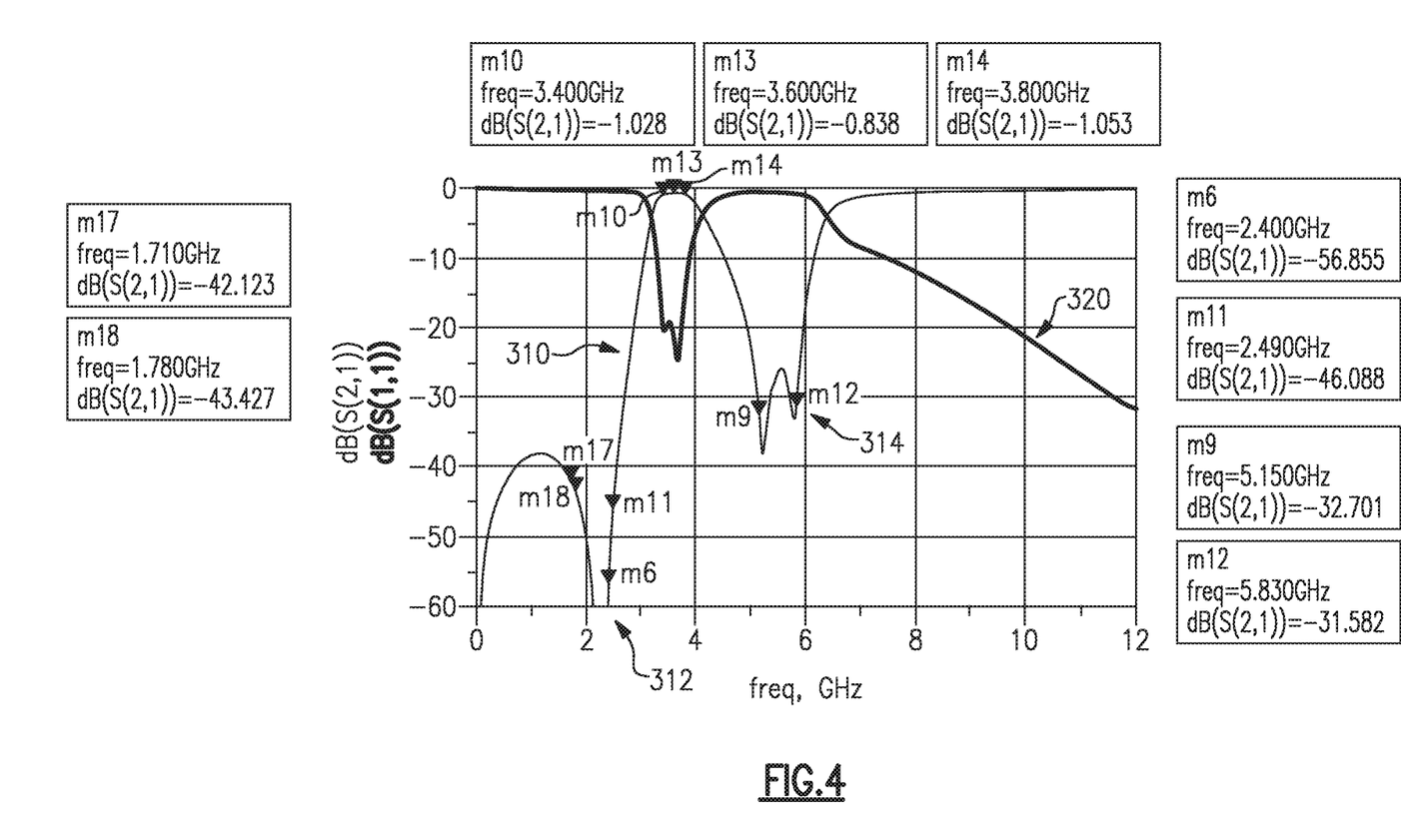
FIG. 4 is a graph showing the frequency response of an example of the capacitive-coupled bandpass filter of FIGS. 2 and 3.

In certain examples the filter 200 can be configured with a primary passband extending from 3.4 GHz to 3.6 GHz, and with harmonic suppression notches at the commonly-used wifi frequencies of 2.4 GHz and 5.4 GHz. In one example, the first notch circuit 210 provides a notch in the frequency response of the filter 200 around approximately 2.4 GHz, and the second notch circuit 220 provides a notch in the frequency response of the filter 200 around approximately 5.4 GHz. FIG. 4 is a graph showing the simulated frequency response of an example of the filter 200, with notches 312 and 314 around 2.4 GHz and 5.4 GHz, respectively, clearly visible. In FIG. 4, curve 310 represents the scattering parameter S(2,1) in decibels as a function of frequency (frequency is shown in GHz along the horizontal axis from 0 GHz to 12 GHz), and curve 320 represents the scattering parameter S(1,1) in decibels as a function of frequency. As known to the those skilled in the art, the scattering parameter S(1,1) is representative of the input return loss of the filter 200, and the scattering parameter S(2,1) is representative of the insertion loss of the filter 200. The simulation shows a deep first notch 312 around measurement point m6 (2.400 GHz) extending between measurement points m17 (1.710 GHz) and m11 (2.490 GHz). As illustrated, the insertion loss at 2.4 GHz is almost 57 dB. The simulation further shows a second notch 314 around 5.4 GHz, extending between measurement points m9 (5.150 GHz), where the insertion loss is over 32 dB, and m12 (5.830 GHz), where the insertion loss is about 31.5 dB. Thus, the filter 200 provides harmonic suppression notches greater than 30 dB at both 2.4 GHz and 5.4 GHz. In addition, as shown in FIG. 4, the simulation indicates that the filter 200 achieves an insertion loss of less than 1.1 dB over the passband extending between measurement points m10 (3.400 GHz) and m14 (3.800 GHz).

For the simulation results presented in FIG. 4, a 50 Ohm impedance was simulated at each of the input contact 102 and the output contact 104, and the components of the filter 200 had the following characteristics:

Each of the three series capacitors 110 was simulated with a quality factor (Q) of 70 at 3.5 GHz, and a constant mode setting for the Q. The mode setting defines the frequency dependence of the Q. The series capacitor 110 closest to the input contact 102 and the series capacitor 110 closest to the output contact 104 each had a capacitance value of 0.83 picofarads (pF). The center series capacitor 110 had a capacitance value of 0.45 pF.

In the first notch circuit 210, the first capacitor 212a and the third capacitor 212b were each simulated with a capacitance value of 0.28 pF, a Q of 70 at 3.5 GHz, and constant mode setting for the Q. The first inductor 122a was simulated with an inductance value of 2.75 nanohenries (nH), a Q of 35 at 100 megahertz (MHz) with the Q mode setting being proportional to the square root of frequency, and a dc resistance value (Rdc) of 0 Ohms. The third inductor 122b was simulated with an inductance value of 3.4 nH, a Q of 35 at 100 MHz with the Q mode setting being proportional to the square root of frequency, and Rdc=0 Ohms.

In the second notch circuit 220, the second capacitor 124a and the fourth capacitor 124b were each simulated with a capacitance value of 1.94 pF, a Q of 120 at 3.5 GHz, and a constant mode setting for the Q. The second inductor 222a and fourth inductor 222b were each simulated with an inductance value of 2.57 nH, a Q of 50 at 100 MHz with the Q mode setting being proportional to the square root of frequency, and Rdc=0 Ohms.

Thus, according to certain aspects and embodiments, the capacitive-coupled bandpass filter 200 can maintain excellent passband performance while also providing two notches, for example, at 2.4 GHz and 5.4 GHz (although notches at other frequencies can be achieved by varying the capacitance or inductance values of the filter components in the first and second notch circuits 210, 220), for harmonic suppression. Embodiments of the filter 200 may be implemented using hybrid component or semiconductor technologies to achieve a more compact design. For example, the components of the first notch circuit 210 (i.e., the first capacitor 212a, the first inductor 122a, the third capacitor 212b, and the third inductor 122b) may be integrated passive device (IPD) components. The series coupling capacitors 110 may also be IPD components. In contrast, the components of the second notch circuit 220 may be implemented with different technologies, such that the overall filter 200 has a hybrid IPD topology. For example, the second and fourth capacitors 124a, 124b may be surface mount (SMT) components, and the second and fourth inductors 222a, 222b may be implemented as coils within a multi-chip module (MCM) laminate substrate. For example, the filter 200 may be part of a multi-chip module used in a power amplifier or receiver/transceiver module, where the IPD and SMT components, along with various other components are mounted on a multi-chip module laminate substrate. The second and fourth inductors 222a, 222b may be implemented as printed copper (or other conductive) coil-shaped traces on the substrate, thereby achieving a more compact filter design since MCM coil inductors are typically smaller than SMT inductors.

Thus, aspects and embodiments provide a capacitive-coupled bandpass filter including two harmonic suppression notches. As discussed above, to generate those harmonic notch bands, different series L/C resonators in shunt are connected between the series coupling capacitors 110, as shown in FIG. 2. Compared to a conventional capacitive-coupled bandpass filter, embodiments of the filter 200 can accommodate the two harmonic suppression bands with minimum filter components. For example, as shown in FIG. 2, the filter 200 may include only 11 filter components (seven capacitors and four inductors). As discussed above, in certain examples, the harmonic suppression notches are provided at 2.4 GHz and 5.4 GHz. In addition, in certain examples the 5.4 GHz notch circuit 220 can be advantageously implemented using MCM coil inductors. By employing the harmonic suppression notches, the filter 200 shows an improved upper frequency cutoff characteristic. Further, because the filter topology may use a minimum number of elements compatible with industry specifications for ultra-high band filters for mobile wireless devices, size and cost reductions may be achieved relative to other approaches for providing harmonic suppression.

Figure 5:
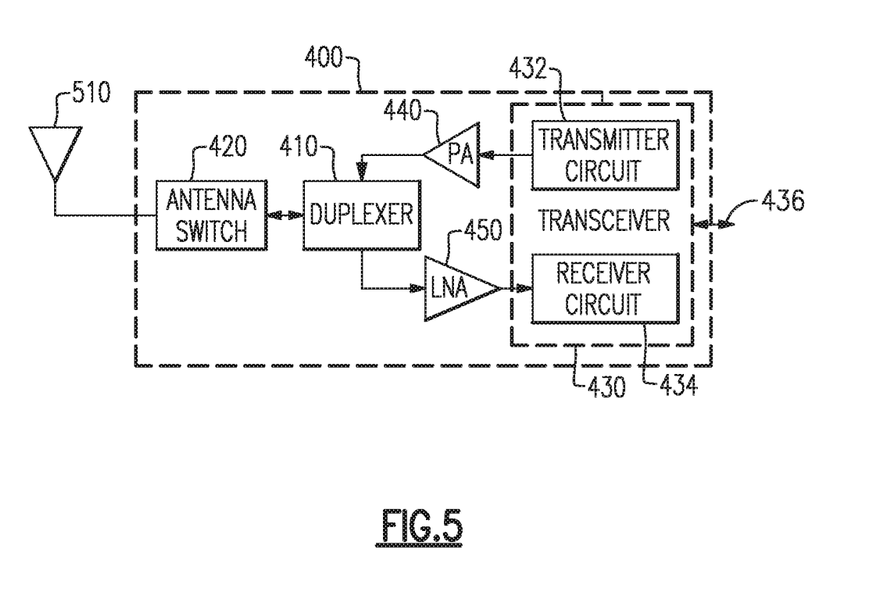
FIG. 5 is a block diagram of one example of an RF front-end module in which embodiments of the capacitive-coupled bandpass filter of FIGS. 2 and 3 can be used.

Embodiments of the capacitive-coupled bandpass filter 200 may be used in a variety of devices and modules, including radio frequency (RF) front-end modules, for example. FIG. 5 is a block diagram of one example of an RF front-end module 400 as may be used in a communications device, such as a mobile phone, for example, to transmit and receive RF signals. The front-end module 400 is connected to an antenna 510 and includes a duplexer 410 and an antenna switch 420 such that the front-end module 400 can be configured to switch operation between different frequency bands or different operating modes, such as transmit and receive modes, for example. In the example illustrated in FIG. 5, the antenna switch 420 and the duplexer 410 are shown as separate components, and the antenna switch 420 is positioned between the duplexer 410 and the antenna 510; however, in other examples the duplexer 410 can be positioned between the antenna switch 420 and the antenna 510, or the antenna switch 420 and the duplexer 410 can be integrated into a single module. The front-end module 400 includes a transceiver 430 that is configured to generate RF signals for transmission and process received RF signals. The transceiver 430 can include a transmitter circuit 432 and a receiver circuit 434. In some embodiments, transmission and reception functionalities can be implemented in separate components (e.g. a transmit module and a receiving module), or be implemented in the same module as shown in FIG. 5. Signals generated for transmission by the transmitter circuit 432 are received by a power amplifier module 440, which amplifies the generated signals from the transceiver 430. The power amplifier module 440 can include one or more power amplifiers. The front-end module 400 further includes a low noise amplifier module 450, which amplifies received signals from the antenna 510 and provides the amplified signals to the receiver circuit 434 of the transceiver 430. The transceiver 430 can communicate with other circuitry in a wireless device or other component in which the front-end module 400 is used, as indicated by arrow 436. According to certain examples, embodiments of the capacitive-coupled filter 200 may be included in the power amplifier module 440, in the duplexer 410 (whether a stand-alone component or integrated with the antenna switch 420), or in the receiver circuit 434 of the transceiver 430.

Figure 6:
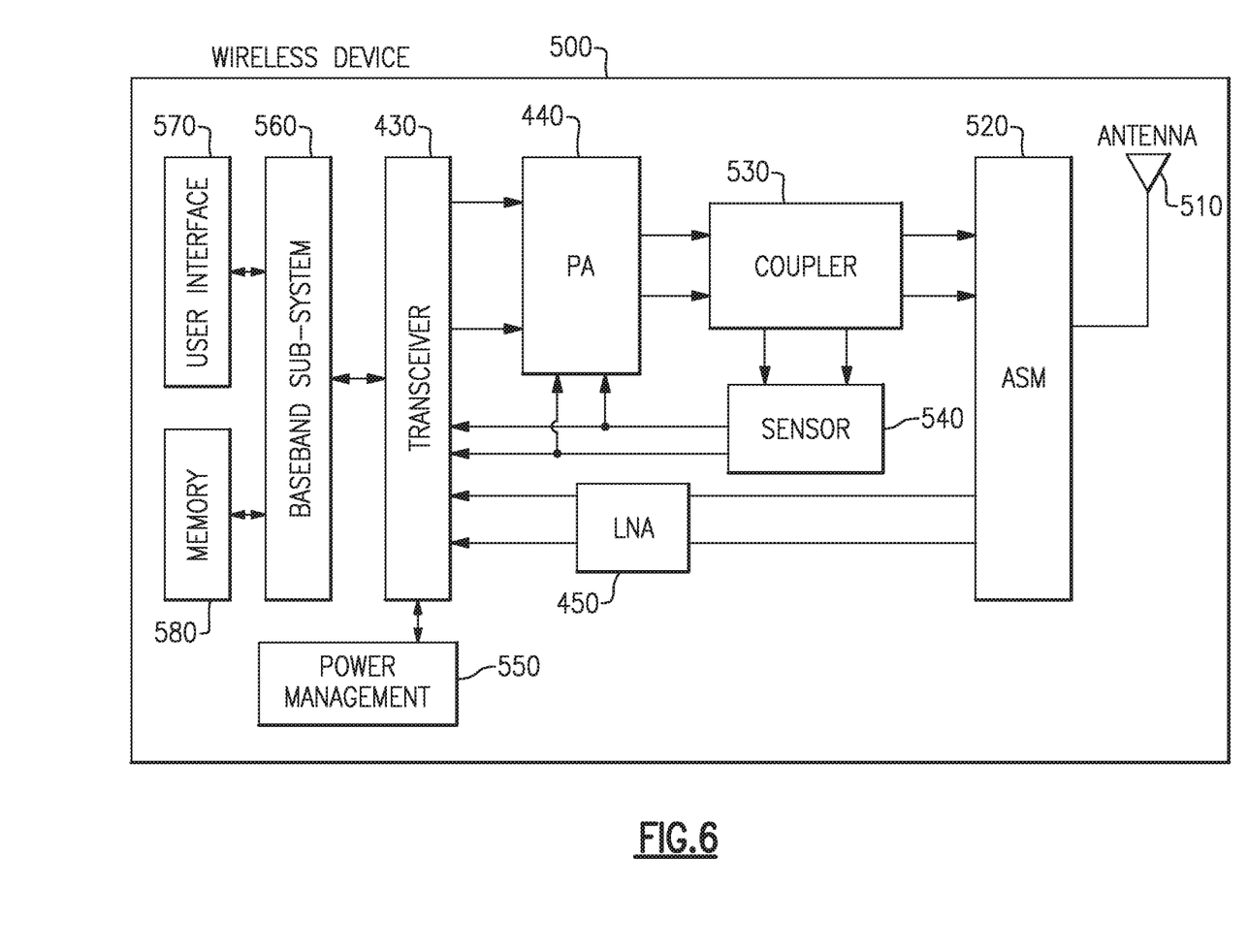
FIG. 6 is a block diagram of one example of a wireless device in which embodiments of the capacitive-coupled bandpass filter of FIGS. 2 and 3 can be used.

FIG. 6 is a block diagram of one example of a wireless device 500 which may include embodiments of the front-end module 400 or similar components. The wireless device 500 can be a cellular phone, smart phone, tablet, modem, communication network or any other portable or non-portable device configured for voice and/or data communication. The wireless device 500 can receive and transmit signals from the antenna 510. The wireless device 500 includes an antenna switch module 520 that can be used to switch between a transmitting mode and receiving mode of the wireless device 500, for example, or between different transmit or receive frequency bands. In certain examples the antenna switch module 520 includes the antenna switch 420 and duplexer 410 of the front-end module 400 discussed above. The wireless device 400 further includes the transceiver 430 that is configured to generate signals for transmission and/or to process received signals. As shown in FIG. 6, in certain embodiments the antenna 510 both receives signals that are provided to the transceiver 430 via the antenna switch module 520 and also transmits signals from the wireless device 500. However, in other examples multiple antennas can be used. As discussed above, in certain examples, embodiments of the capacitive-coupled bandpass filter 200 may be included in the transceiver 430.

Signals generated for transmission are received by the power amplifier (PA) module 440 which amplifies the generated signals from the transceiver 430, as discussed above. The power amplifier module 440 can be used to amplify a wide variety of RF or other frequency-band transmission signals. For example, the power amplifier module 440 can receive an enable signal that can be used to pulse the output of the power amplifier to aid in transmitting a wireless local area network (WLAN) signal or any other suitable pulsed signal. The power amplifier module 440 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. The receive path may include the low noise amplifier (LNA) 450 configured to amplify the received signals. As discussed above, in certain examples, embodiments of the capacitive-coupled bandpass filter 200 can be included in the power amplifier module 440. In other examples, although not shown in FIGS. 5 and 6, the output(s) of the power amplifier module 440 may be connected to the input contact 102 of one or more bandpass filters 200, and the filter(s) 200 can thus be connected between the power amplifier module 440 and the duplexer 410 (in the case of the example shown in FIG. 5) or an electromagnetic coupler 530 (in the case of the example shown in FIG. 6). Embodiments of the filter 200 may also be used with other components of the wireless device 500.

The directional coupler 530 can be used to extract a portion of the power from the RF signal traveling between the power amplifier module 440 and the antenna 510 and provide the coupled signal(s) to a sensor module 540. The sensor module 540 may send information to the transceiver 430 and/or directly to the power amplifier module 440 as feedback for making adjustments to regulate the output power level of the power amplifier module 440. In certain embodiments in which the wireless device 500 is a mobile phone having a time division multiple access (TDMA) architecture, the directional coupler 530 can advantageously manage the amplification of an RF transmitted power signal from the power amplifier module 440. In a mobile phone having a time division multiple access (TDMA) architecture, such as those found in Global System for Mobile Communications (GSM), code division multiple access (CDMA), and wideband code division multiple access (W-CDMA) systems, the power amplifier module 440 can be used to shift power envelopes up and down within prescribed limits of power versus time. For instance, a particular mobile phone can be assigned a transmission time slot for a particular frequency channel. In this case the power amplifier module 440 can be employed to aid in regulating the power level one or more RF power signals over time, so as to prevent signal interference from transmission during an assigned receive time slot and to reduce power consumption. In such systems, the directional coupler 530 can be used to measure the power of a power amplifier output signal to aid in controlling the power amplifier module 440, as discussed above.

Still referring to FIG. 6, the wireless device 500 further includes a power management system 550 that is connected to the transceiver 430 and that manages the power for the operation of the wireless device. The power management system 550 can also control the operation of a baseband sub-system 560 and other components of the wireless device 500. The power management system 550 can include, or can be connected to, a battery (not shown) that supplies power for the various components of the wireless device 500. The power management system 550 can further include one or more processors or controllers that may provide control signals to configure operation of the various components of the wireless device 500, including the power amplifier module 440 and the directional coupler 530, for example. In one embodiment, the baseband sub-system 560 is connected to a user interface 570 to facilitate various input and output of voice and/or data provided to and received from the user. The baseband sub-system 560 can also be connected to memory 580 that is configured to store data and/or instructions to facilitate the operation of the wireless device, and/or to provide storage of information for the user.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, it is to be appreciated that embodiments of the methods and apparatuses discussed herein are not limited in application to the details of construction and the arrangement of components set forth in the foregoing description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. References to "first," "second," "third," etc. are intended for convenience of description only and not intended to imply any order or relative importance among the identified elements. Thus, the foregoing description and drawings are by way of example only, and the scope of the invention should be determined from proper construction of the appended claims, and their equivalents.

What is claimed is:

1. A capacitive-coupled bandpass filter comprising:
   a plurality of coupling capacitors connected in series along a signal path extending between an input contact and an output contact;
   a first shunt arm including a first capacitor and a first inductor connected in series between a first point along the signal path and a reference potential;
   a second shunt arm connected in parallel with the first shunt arm between the first point along the signal path and the reference potential, the second shunt arm including a second capacitor connected in series with a second inductor;
   a third shunt arm including a third capacitor and a third inductor connected in series between a second point along the signal path and the reference potential; and
   a fourth shunt arm connected in parallel with the third shunt arm between the second point along the signal path and the reference potential, the fourth shunt arm including a fourth capacitor connected in series with a fourth inductor.

2. The capacitive-coupled bandpass filter of claim 1 wherein the second point is a node in the signal path that is coupled to one of the two coupling capacitors of the plurality of coupling capacitors.

3. The capacitive-coupled bandpass filter of claim 1 wherein the plurality of coupling capacitors includes:
   a first coupling capacitor connected in series between the input contact and the first point along the signal path;
   a second coupling capacitor connected in series between the first point along the signal path and the second point along the signal path; and
   a third coupling capacitor connected in series between the second point along the signal path and the output contact.

4. The capacitive-coupled bandpass filter of claim 3 wherein the plurality of coupling capacitors are integrated passive device components.

5. The capacitive-coupled bandpass filter of claim 4 wherein the first capacitor, the first inductor, the third capacitor, and the third inductor are integrated passive device components;
   wherein the second capacitor and the fourth capacitor are surface mount components;
   wherein the capacitive-coupled bandpass filter is implemented in a multi-chip module; and
   wherein the second inductor and the fourth inductor are implemented as printed coils on a substrate of the multi-chip module.

6. The capacitive-coupled bandpass filter of claim 3 wherein the first shunt arm and the third shunt arm together are configured to provide a first harmonic suppression notch in a frequency response of the capacitive-coupled bandpass filter; and
   wherein the second shunt arm and the fourth shunt arm together are configured to provide a second harmonic suppression notch in the frequency response of the capacitive-coupled bandpass filter.

7. The capacitive-coupled bandpass filter of claim 6 wherein the first harmonic suppression notch is at a frequency of 2.4 GHz, and the second harmonic suppression notch is at a frequency of 5.4 GHz.

8. The capacitive-coupled bandpass filter of claim 1 wherein the capacitive-coupled bandpass filter is included in a radio frequency (RF) front-end module, the RF front-end module including:
   an antenna port;
   a transceiver configured to generate RF transmit signals for transmission and to receive and process received RF signals;
   a power amplifier module configured to receive and amplify the RF transmit signals from the transceiver, at least one of the transceiver and the power amplifier module including the capacitive-coupled bandpass filter;
   a duplexer coupled between the power amplifier module and the antenna port and configured to direct the RF transmit signals from the power amplifier module to the antenna port and to direct the received RF signals from the antenna port to the transceiver;
   a low noise amplifier module coupled between the duplexer and the transceiver and configured to receive and amplify the received RF signals; and
   an antenna switch connected between the duplexer and the antenna port.

9. The capacitive-coupled bandpass filter of claim 8 wherein the transceiver includes a transmitter circuit configured to generate the RF transmit signals and a receiver circuit configured to process the received RF signals, the receiver circuit including the capacitive-coupled bandpass filter.

10. The capacitive-coupled bandpass filter of claim 1 wherein the capacitive-coupled bandpass filter is included in a wireless device, the wireless device including:
an antenna;
an antenna switch module coupled to the antenna;
a transceiver configured to generate RF transmit signals for transmission by the antenna and to receive and process received RF signals from the antenna;
a power amplifier module coupled between the transceiver and the antenna switch module and configured to receive and amplify the RF transmit signals from the transceiver, at least one of the transceiver and the power amplifier module including the capacitive-coupled bandpass filter; and
a low noise amplifier module coupled between the antenna switch module and the transceiver and configured to receive and amplify the received RF signals from the antenna switch module.

11. The capacitive-coupled bandpass filter of claim 10 wherein the wireless device includes:
an electromagnetic coupler coupled between the power amplifier module and the antenna switch module and configured to electromagnetically couple portions of the RF transmit signals from a transmit signal path extending between the power amplifier module and the antenna switch module to provide coupled signals; and
a sensor module configured to receive the coupled signals from the electromagnetic coupler and to provide control signals to at least one of the transceiver and the power amplifier module based on the coupled signals.

12. The capacitive-coupled bandpass filter of claim 11 wherein the wireless device includes:
a power management system coupled to the transceiver and configured to manage power for operation of the wireless device;
a baseband sub-system coupled to the transceiver;
a user interface connected to the baseband sub-system; and
a memory connected to the baseband sub-system and configured to store data.

13. The capacitive-coupled bandpass filter of claim 10 wherein the transceiver includes:
a transmitter circuit configured to generate the RF transmit signals and a receiver circuit configured to process the received RF signals, the receiver circuit including the capacitive-coupled bandpass filter.

14. A capacitive-coupled bandpass filter comprising:
a plurality of coupling capacitors connected in series along a signal path extending between an input contact and an output contact;
a first harmonic suppression notch circuit configured to provide a first harmonic suppression notch in a frequency response of the capacitive-coupled bandpass filter, the first harmonic suppression notch circuit including a first pair of series L/C resonators connected in shunt between the signal path and a reference potential the first pair of series L/C resonators connected at a node in the signal path, the node coupled to two coupling capacitors of the plurality of coupling capacitors; and
a second harmonic suppression notch circuit configured to provide a second harmonic suppression notch in the frequency response of the capacitive-coupled bandpass filter, the second harmonic suppression notch circuit including a second pair of series L/C resonators connected in shunt between the signal path and the reference potential.

15. The capacitive-coupled bandpass filter of claim 14 wherein the second pair of series L/C resonators is connected at a node in the signal path that is coupled to one of the two coupling capacitors of the plurality of coupling capacitors.

16. The capacitive-coupled bandpass filter of claim 14 wherein the first harmonic suppression notch is at 2.4 GHz and the second harmonic suppression notch is at 5.4 GHz.

17. The capacitive-coupled bandpass filter of claim 16 wherein a passband of the capacitive-coupled bandpass filter extends from 3.4 GHz to 3.8 GHz.

18. The capacitive-coupled bandpass filter of claim of claim 17 wherein the capacitive-coupled bandpass filter has an insertion loss in the passband of less than 1.1 dB.

19. The capacitive-coupled bandpass filter of claim 18 wherein the capacitive-coupled bandpass filter has an insertion loss in each of the first and second harmonic suppression notches of greater than 30 dB.

20. The capacitive-coupled bandpass filter of claim 14 wherein the first pair of series L/C resonators includes a first shunt arm and a third shunt arm, the first shunt arm having a first capacitor connected in series with a first inductor between a first point along the signal path and the reference potential, and the third shunt arm having a third capacitor connected in series with a third inductor between a second point along the signal path and the reference potential; and
wherein the second pair of series L/C resonators includes a second shunt arm connected in parallel with the first shunt arm between the first point along the signal path and the reference potential, and a fourth shunt arm connected in parallel with the second shunt arm between the second point along the signal path and the reference potential, the second shunt arm having a second inductor connected in series with a second capacitor, and the fourth shunt arm having a fourth inductor connected in series with a fourth capacitor.

21. The capacitive-coupled bandpass filter of claim 20 wherein the plurality of coupling capacitors includes:
a first coupling capacitor connected in series between the input contact and the first point along the signal path;
a second coupling capacitor connected in series between the first point along the signal path and the second point along the signal path; and
a third coupling capacitor connected in series between the second point along the signal path and the output contact.

22. The capacitive-coupled bandpass filter of claim 20 wherein the plurality of coupling capacitors are integrated passive device components.

23. The capacitive-coupled bandpass filter of claim 22 wherein the first capacitor, the third capacitor, the first inductor, and the third inductor are integrated passive device components;
wherein the second capacitor and the fourth capacitor are surface mount components;
wherein the capacitive-coupled bandpass filter is implemented in a multi-chip module; and
wherein the second inductor and the fourth inductor are implemented as printed coils on a substrate of the multi-chip module.

24. The capacitive-coupled bandpass filter of claim 20 wherein the first inductor and the second capacitor together form a first passband resonator, the third inductor and the fourth capacitor together form a second passband resonator, and the first and second passband resonators together with the plurality of coupling capacitors configure a passband of the capacitive-coupled bandpass filter.

25. The capacitive-coupled bandpass filter of claim 24 wherein the passband of the capacitive-coupled bandpass filter extends from 3.4 GHz to 3.8 GHz.

26. The capacitive-coupled bandpass filter of claim 25 wherein the first harmonic suppression notch is at 2.4 GHz and the second harmonic suppression notch is at 5.4 GHz.

27. The capacitive-coupled bandpass filter of claim of claim 26 wherein the capacitive-coupled bandpass filter has an insertion loss in the passband of less than 1.1 dB.

28. The capacitive-coupled bandpass filter of claim 27 wherein the capacitive-coupled bandpass filter has an insertion loss in each of the first and second harmonic suppression notches of greater than 30 dB.

* * * * *